United States Patent [19]

Flachslaender

[11] Patent Number: 5,795,164
[45] Date of Patent: Aug. 18, 1998

[54] ASSEMBLED PRINTED CIRCUIT BOARD

[75] Inventor: Erwin Flachslaender, Calw-Stammheim, Germany

[73] Assignee: Hewlett-Packard Company, Palo Alto, Calif.

[21] Appl. No.: 745,914

[22] Filed: Nov. 7, 1996

[30] Foreign Application Priority Data

Nov. 15, 1995 [DE] Germany ............... 195 42 540.5

[51] Int. Cl.⁶ ................................................ H01R 9/09
[52] U.S. Cl. .................................... 439/79; 439/83
[58] Field of Search .......................... 439/79, 80, 83, 439/876

[56] References Cited

U.S. PATENT DOCUMENTS 5,201,664  4/1993  Korsunsky et al. ................. 439/83

OTHER PUBLICATIONS

IBM Technical Disclosure Bulletin, vol. 28, No. 12, May, 1986, pp. 5347–5349, "Plastic Ringed High Density J Leaded Chip Carrier".

Patents Abstracts of Japan, E–1085, Jul. 3, 1991, vol. 15/No. 261, Kiyoshi Morimoto, "Printed Circuit Board".

Patents Abstracts of Japan, E–1363, May 13, 1993, vol. 17/No. 238, Shinji Saito, "Printed Wiring Board".

*Primary Examiner*—Neil Abrams
*Assistant Examiner*—T. C. Patel

[57] ABSTRACT

Components, such as a plug connector are soldered in surface mounted technology on a printed circuit board. These components or devices have several parallel pin rows. For repairing the inner pin row or replacing the component, an opening is provided in the circuit board. Therefore the pins of the inner pin row can be reached with tools, particularly a soldering tool.

7 Claims, 5 Drawing Sheets

1

ASSEMBLED PRINTED CIRCUIT BOARD

FIELD OF THE INVENTION

The present invention relates to an assembled printed circuit board having at least one component, whose connection pins are soldered on the same side of the circuit board as the component, preferably in surface mounted form, and which is laterally provided with at least two parallel pin rows.

BACKGROUND OF THE INVENTION

In the manufacture of electronic circuit boards, the need for ever-higher integration has for some years led to the conventional technology—in which the bent pins of the components are placed through holes in the circuit board and soldered there—has been replaced by so-called surface mounted technology (SMT). The pins of the individual components soldered to the circuit board are bent twice by approximately 90°, namely directly on the component towards the circuit board and at the circuit board-side end of the pins again in the opposite direction, so that the end piece of the pins rests on the circuit board and can be soldered there. Thus, with this technology it is no longer necessary to drill holes for the pins of the individual components in the circuit board and consequently there is a much higher component density on the circuit board, because the components can also be made in a much more compact manner. The components or devices in surface mounted technology are referred to as surface mounted devices (SMD).

A further development with a view to higher integration is the use of components or devices with multiple pin rows. The components no longer have two individual pin rows, which are in each case positioned along the two longitudinal sides of the component (as in conventional semiconductor packaging technology), instead there are two or more pin rows for each longitudinal side. This consideration also applies for components soldered only to one longitudinal side and in this case two or more parallel pin rows are arranged along the longitudinal side to be soldered. There are numerous corresponding further developments, e.g. quadratic packs for semiconductor chips having on each of the four sides two or more parallel pin rows.

The two principles are now also combined, i.e. surface mounting is in particular also used for components or devices having several parallel pin rows on each longitudinal side. However, the following problem arises. If one of the components with several pin rows fails, e.g. due to a cold solder joint, a solder bridge, a fault in the circuit or excessive wear or ageing has occurred, the component cannot be readily replaced. It is admittedly initially possible by using a hand soldering tool to desolder the outer pin row and the contact ends of the outer pins can then be bent upwards, so that the inner pins can be reached with the soldering tool. However, it is not possible to solder on a new component with this technology. Thus, after removing the defective or aged component and fitting a replacement component, the circuit board must again pass through the soldering process, i.e. the so-called reflow process. This is admittedly possible in principle, but increases the stressing and therefore the probability of failure of the circuit board and all the components located thereon to a significant extent. As during the performance of the reflow process, the solder joints of the other components on the circuit board are also softened, once again an additional fault source is introduced, because naturally these solder joints can lead to stress cracks, cold soldered connections, etc.

Therefore the replacement of components on a SMT circuit board is a difficult, expensive and fault-prone process. When there are more than two parallel pin rows it can no longer be performed, because then the innermost pin row can no longer be reached with a manual soldering tool, even if the pins of the outer pin rows are bent upwards.

Therefore the problem of the present invention is to indicate the construction of a printed circuit board of the aforementioned type, in which it is possible to manually desolder and resolder components or devices having several pin rows.

BRIEF DESCRIPTION OF THE INVENTION

According to the invention this problem is solved in that adjacent to the inner pin row of the component (or with respect to the component) a recess is provided in the circuit board. The corresponding recess can e.g. be milled in the circuit board and allows access to the inner pin rows of the component "from below", i.e. from the circuit board side remote from the component. Therefore the pins of the inner pin rows can be desoldered through the circuit board recess and the pins of the outer pin rows from the circuit board assembly side. It is possible in precisely the same way to reach the pins of the inner and outer pin rows of a new component for replacing the defective component, so that the new component can be soldered on, without the circuit board again having to pass through the reflow process. It is naturally also possible in this way to repair circuit boards without replacing a component. This is e.g. the case when repairing a cold solder joint. In this case it is merely necessary to heat again the solder joint, optionally accompanied by the supply of flux. According to the invention this can also take place on the inner pin rows of a component, without said component having to be desoldered or replaced.

Preferably the opening on the circuit board defined by the recess has an adequate cross-section, in order to reach with a soldering instrument, preferably a soldering iron, said inner pin row from the circuit board side remote from the component. This represents a very advantageous development of the present invention. However, it is not absolutely necessary to introduce a soldering instrument through the recess in the circuit board. Instead of this hot air or the like can be supplied through said recess.

It is advantageous if the connecting pins of the inner pin row of the component project at least partially into the circuit board recess or bridge the latter. In this case the pins are particularly easily accessible and the mechanical seating of the component in the circuit board is improved. Alternatively or additionally the pins of the inner pin row of the component can also be bent at the edges of the recess, preferably towards the circuit board side remote from the component. In this embodiment the component can be very accurately positioned and is mechanically fitted to the circuit board in a more or less self-supporting manner.

It is also advantageous if the circuit board recess extends substantially centrally with respect to the component. In other words, the recess extends substantially centrally to the longitudinal axis of the component between the inner pin rows thereof, so that both pin rows are accessible through the same recess. However, the recess can also be eccentrically positioned or permit access to only an inner pin row, particularly if the component is only soldered with one longitudinal side to the circuit board. It is also appropriate for the recess to be substantially rectangular, because then also the inner pin rows in the vicinity of the front faces of the component are readily accessible.

The invention is particularly suitable for soldering plug and socket means such as plugs, sockets, etc. to a printed circuit board in SMT technology. Such plug and socket means or plug connections are subject to high mechanical stressing as a result of the plugging and unplugging of the connections, as well as the weight of the connector, so that here frequently breaks or similar damage to the solder joints occur. These plug connectors generally only have two parallel pin rows, but on the same side of the connector, so that here, precisely as in other cases, the problem arises of desoldering and resoldering the inner pin row. Specifically when fixing plug connections (but not only in this case), it is advantageous if both the plug and socket means and the recess are located on the edge of the circuit board. In this case the recess can be in the form of a laterally open cavity in the circuit board, i.e. there is no need to completely break through the circuit board (as when drilling a hole), instead a lateral incision or milling being sufficient. (In other words, there is no need to change the topological characteristics of the circuit board).

The invention also relates to a method for the manufacture of a printed circuit board having at least one component, whose connecting pins are soldered on the same side of the circuit board as the component (preferably in surface mounted form) and which laterally has at least one double pin row. In this case, according to the invention, following onto the inner pin row of the component is provided a recess or cavity in the circuit board, preferably by milling or cutting.

A further aspect of the present invention is a method for desoldering the inner pin rows of a component from an aforementioned printed circuit board designed in accordance with the invention. In this case a soldering tool, particularly a hand soldering tool, can be brought through the recess into contact with the connecting pins of the inner pin row of the component, so that the pins of the inner pin row can be easily desoldered. The same naturally applies when resoldering a new component. In this case the invention is characterized by a method, in which the inner pin row of the new component is soldered to the circuit board by a soldering tool projecting through the circuit board recess.

BRIEF DESCRIPTION OF THE FIGURES

The invention is now described in greater detail relative to a preferred embodiment and with reference to the attached drawings, wherein show:

FIG. 2b, a cross-section along reference line IIb—IIb of FIG. 2a.

DETAILED DESCRIPTION OF PREFERRED EMBODIMENTS

Figure 1:
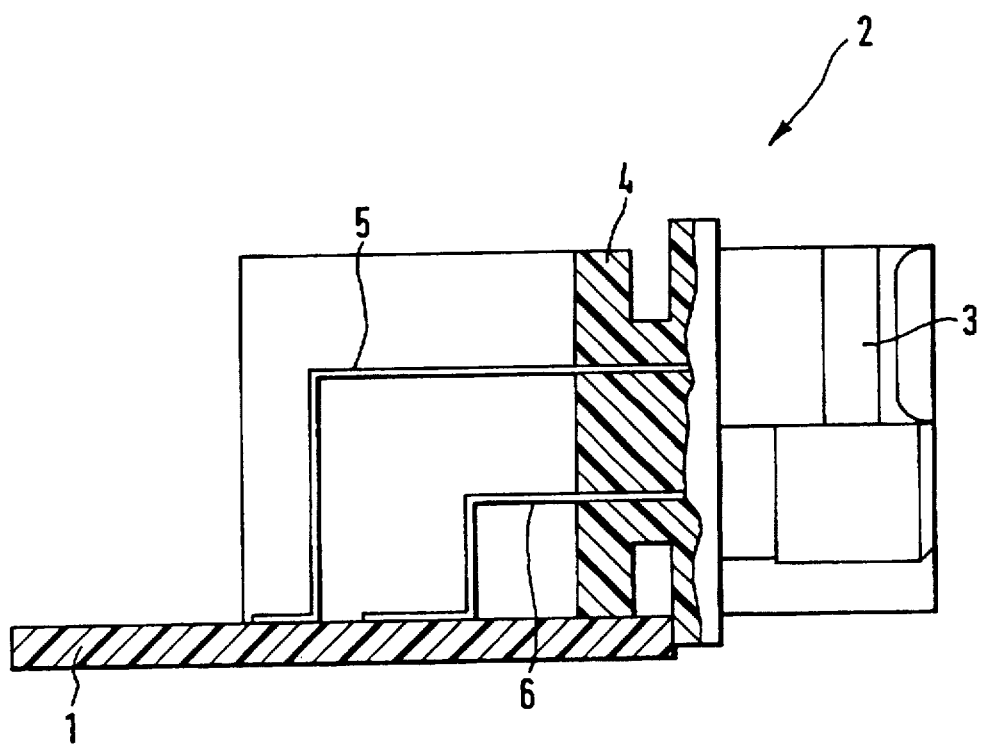
FIG. 1, a cross-section through a SMD plug connector soldered in conventional manner to a circuit board for illustrating the problems resulting from the prior art.

FIG. 1 shows a part of a printed circuit board 1, to which is soldered a plug connector 2. Reference numeral 3 relates to the contacting side of the plug connector, i.e. on this side is mounted the counterpart. The plug connectorterminal plate is designated 4.

Within the plug connector are integrated two connecting pins 5 and 6, which initially extend from the connector in the horizontal direction, i.e. parallel to the circuit board 1 and which are then bent by 90°, so that they run perpendicular to the circuit board. At the outermost end thereof there is again a 90° bend, but on this occasion with the reverse orientation, so that the contact ends of the pins 5 and 6 are parallel on the circuit board 1 and can be soldered there. It is obvious that the pins 5 and 6 continue on perpendicular to the direction in the drawing plane in the form of pin rows, so that a plurality of plug connector terminals is possible. In the terminology used here 5 is a pin of the outer pin row and 6 a pin of the inner pin row.

It is clear from the cross-sectional representation of FIG. 1, which shows the prior art, that in the case of cold solder joints or damage to the plug connector 2, it is almost impossible to completely desolder the component or device and replace it by a new one, because the inner pin row 6 cannot be reached with a hand soldering tool. It is admittedly possible to firstly desolder the outer pin row 5 and bend the outer pins upwards, so that the inner pins 6 can be reached. However, it is not possible with the same technology to solder in a new plug connector 2 to replace the old one. Thus, the circuit board with the replacement plug connector must again pass through the reflow process with all the resulting additional fault sources. It is also e.g. impossible to repair a cold solder joint on pins 6 without desoldering the entire plug connector 2, because the pin 6 is inaccessible for a soldering tool.

Figure 2A:
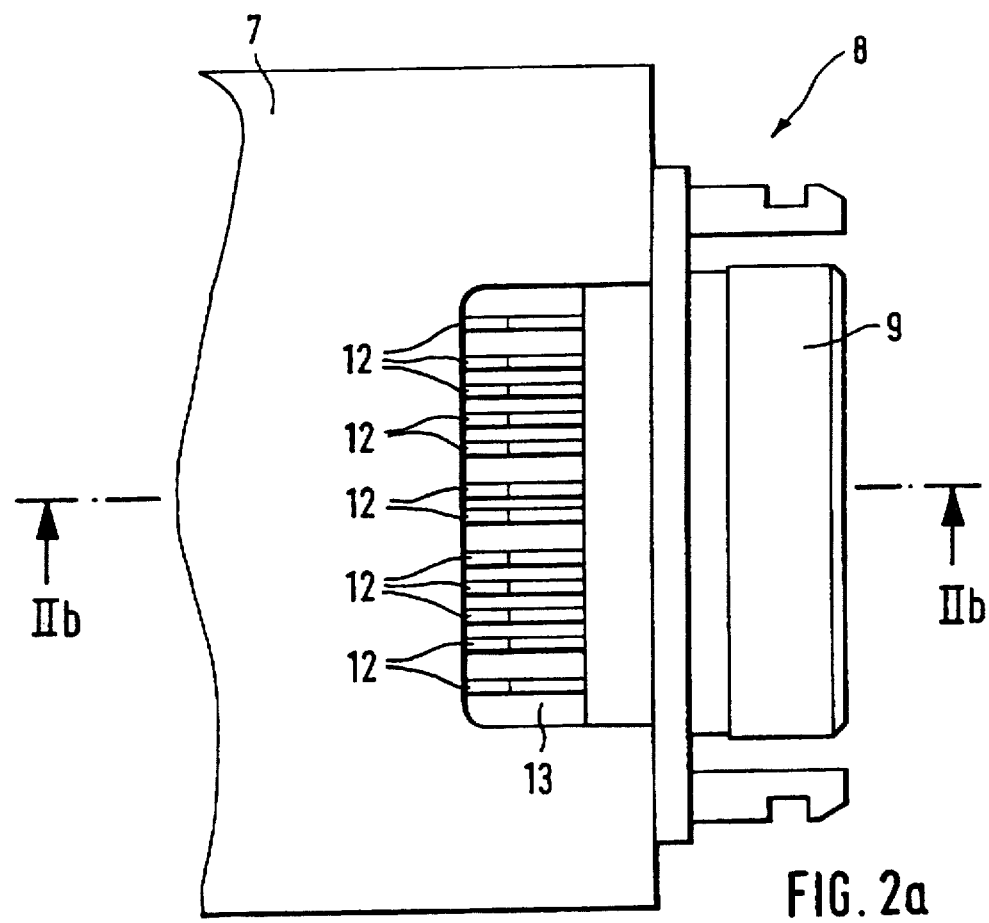
FIG. 2a, the view from below of a circuit board according to the invention, in a first embodiment of the latter.
Figure 2B:
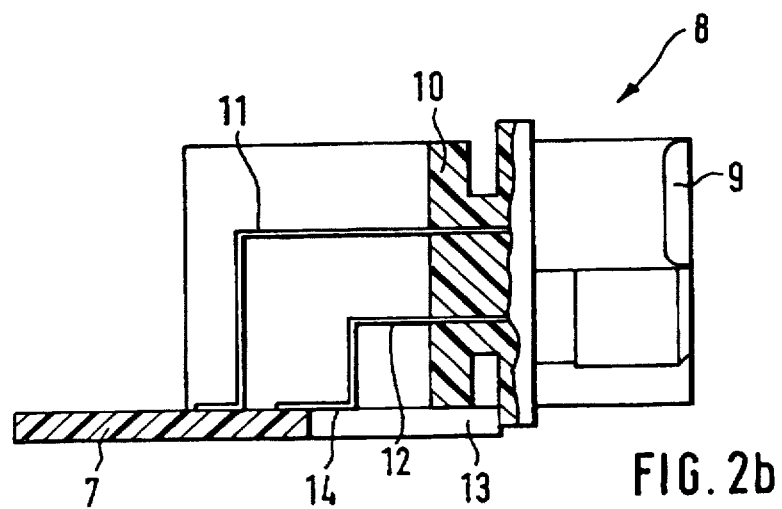

The inventive solution of this problem in a first embodiment is shown in FIGS. 2a and 2b. FIG. 2a is a view from below of the circuit board 7 and FIG. 2b a cross-section along reference line IIb—IIb. The complete plug connector is designated 8, its contact part 9 and its terminal plate 10. A pin of the outer pin row carries the reference numeral 11, whereas the pins of the inner row are designated 12. FIG. 2b only shows a single pin 12 of the inner pin row, whereas FIG. 2a shows the entire pin row.

Adjacent to the inner pin row 12, according to the invention the circuit board 7 has a recess through which the pins of the inner pin row are accessible from the underside of the circuit board 7. This recess provides access for the soldering iron and other mechanical auxiliary tools such as tweezers, hooks or pliers. It is thus possible to both repair solder joints of the inner pin row 12, desolder defective underside of the circuit board 7. This recess provides access for the soldering iron and other mechanical auxiliary tools such as tweezers, hooks or pliers. It is thus possible to both repair solder joints of the inner pin row 12, desolder defective plug connectors 8 and solder in a new replacement plug connector. The pins of the outer pin row 11 are accessible in conventional manner from the top of the circuit board (assembly side).

In the embodiment of FIG. 2b part 14 of the inner pins 12 partially extends over and parallel to the recess 13 of the circuit board. Thus, the pins of the inner pin row are made particularly well accessible for a soldering tool, because the latter only has to be placed on the portion 14 in order to heat the solder joint alongside it to the left.

Figure 3A:
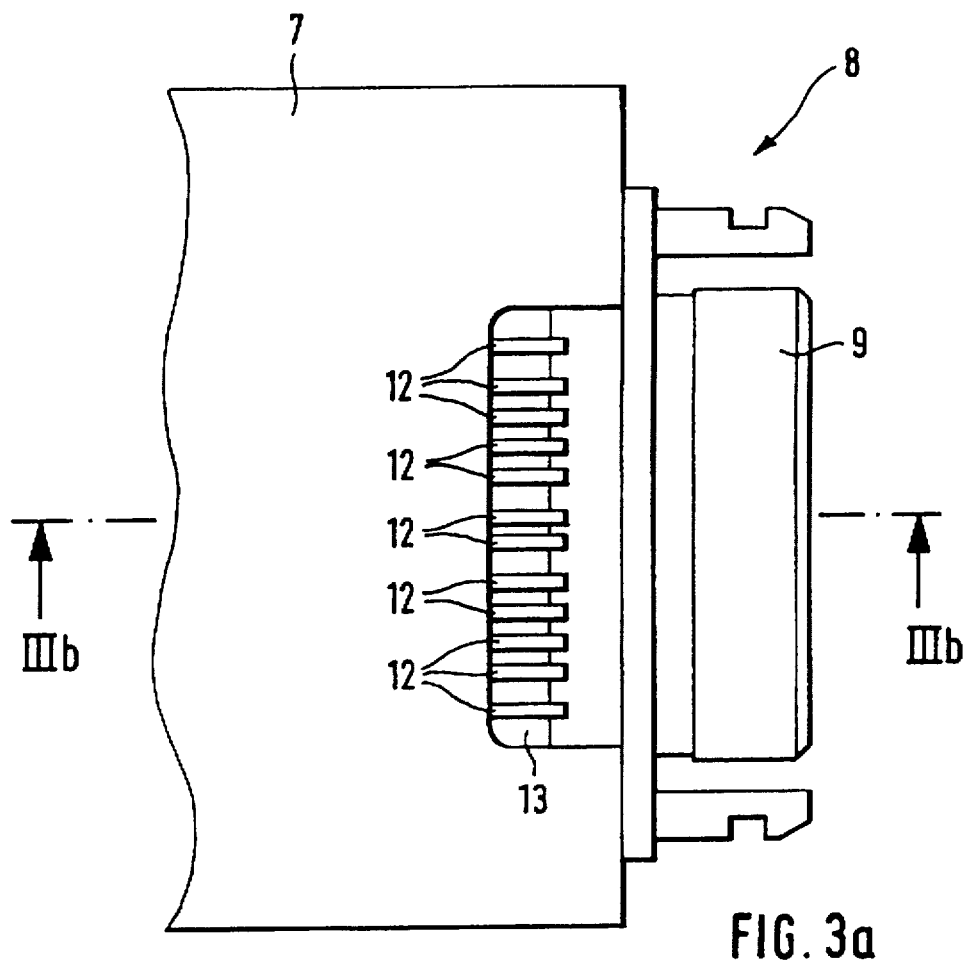
FIGS. 3a & 3b, a second embodiment of the invention in a representation corresponding to FIGS. 2a and 2b.
Figure 3B:
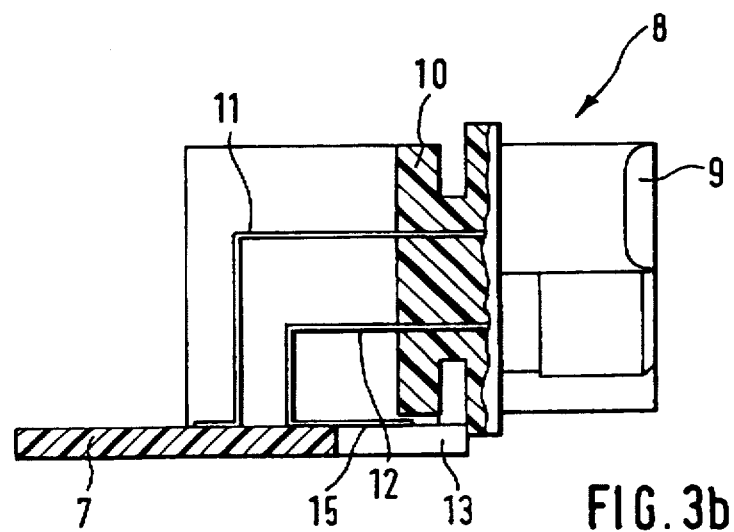
Figure 4A:
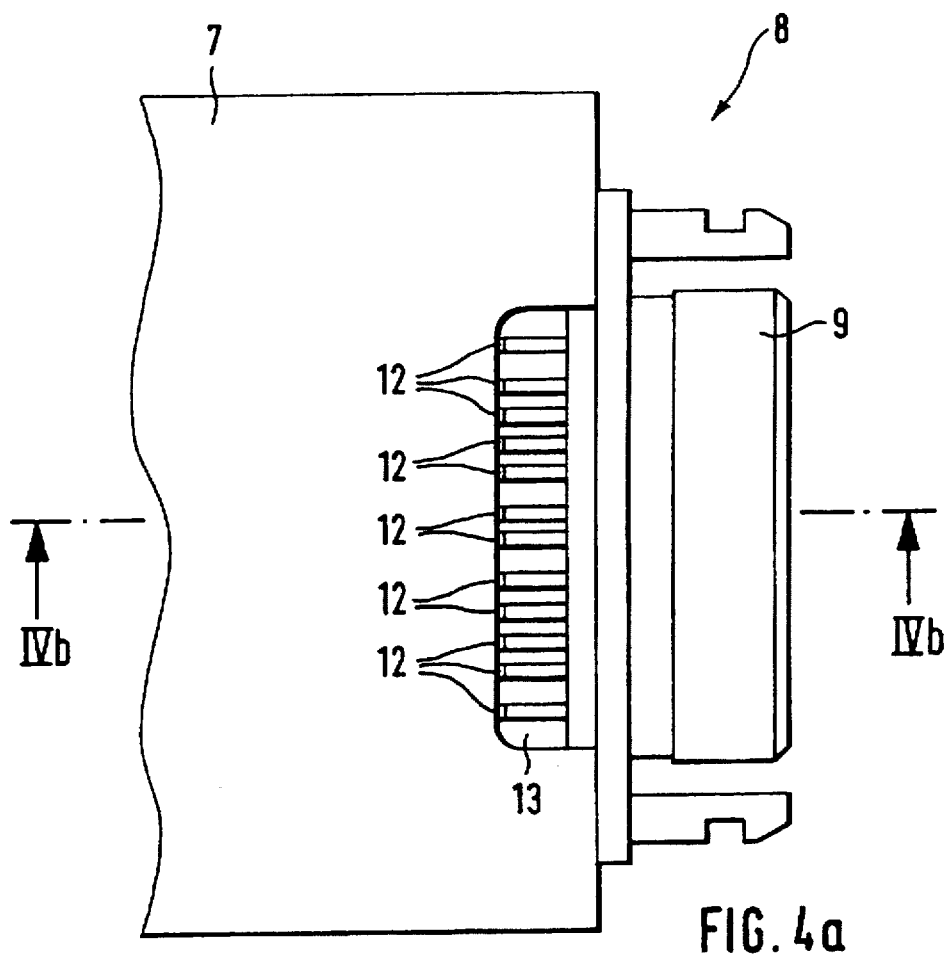
FIGS. 4a & 4b, a third embodiment of the invention, the views once again corresponding to those of FIGS. 2a and 2b.
Figure 4B:
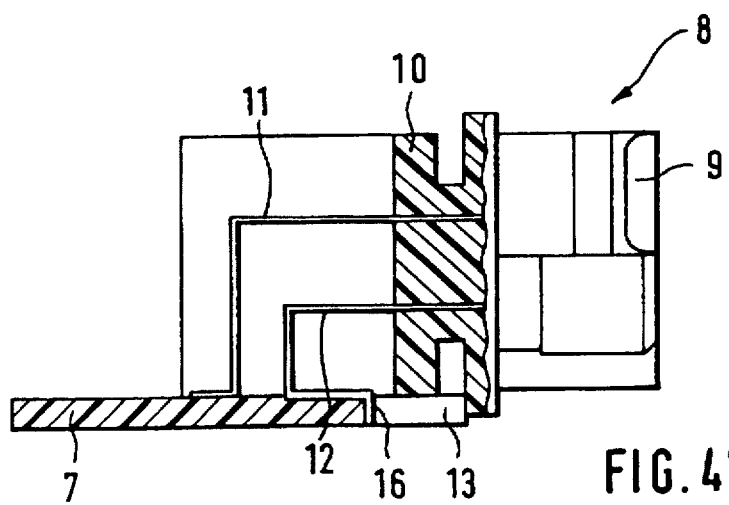

A somewhat different embodiment of the invention is shown in FIGS. 3a and 3b, using the same reference numerals as in FIGS. 2a and 2b. The essential difference here is that the second bend of the inner pin 12 takes place with the same orientation as the first bend, i.e. the contact end 15 of the inner pin 12 terminates in the recess 13. Another somewhat different arrangement is shown in FIGS. 4a and 4b, where the contact end 16 of the inner pin 12 is again so bent that it engages in parallel on the edge of the recess 13. This solution is in particular characterized in that the plug connector has a very firm mechanical seating and no tolerance problems arise.

Figure 5A:
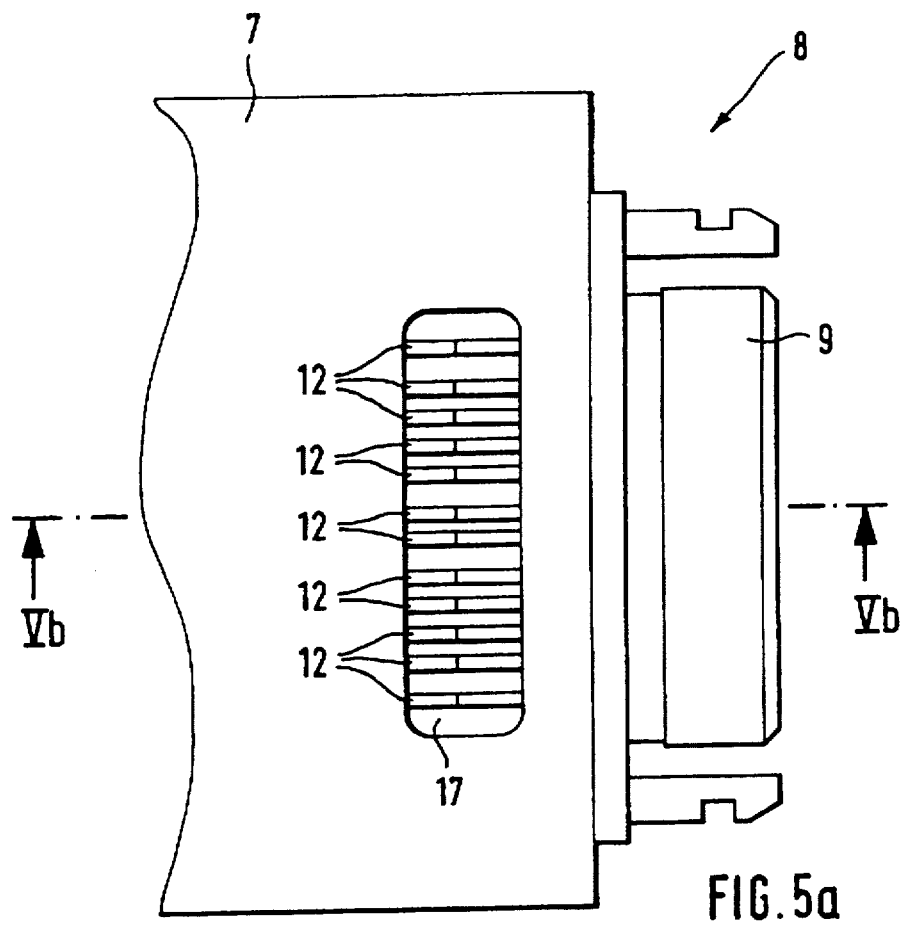
FIGS. 5a & 5b, a fourth embodiment of the invention, once again corresponding to FIGS. 2a and 2b.
Figure 5B:
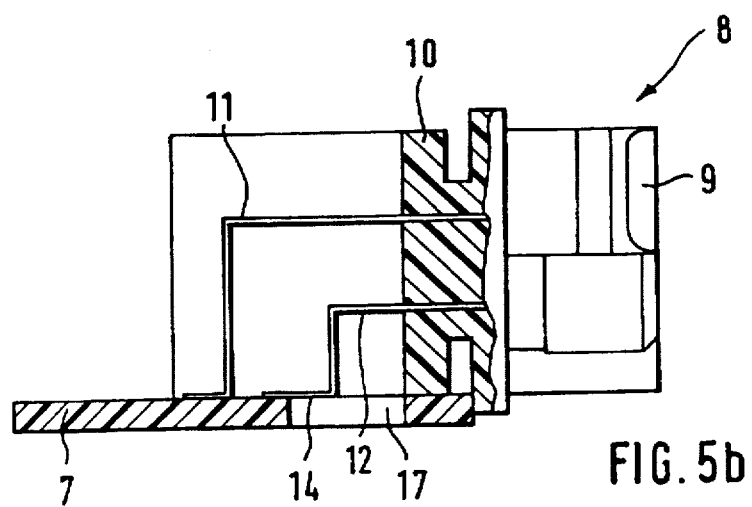

Whereas in the previously described embodiments the recess has been a laterally open cavity, FIGS. 5a and 5b shows a recess 17 in the form of a closed opening in the circuit board 7. As a function of the requirements (e.g. small recess for increasing the mechanical stability of the circuit board), such a construction can be advantageous, even if as a rule due to the easier manufacturability, a laterally open cavity according to FIGS. 2a to 4b would be preferred.

I claim:

1. An assembled printed circuit board having at least one surface mounted component, said component having an array of parallel rows of connecting pins soldered to a same side of the circuit board on which said component is surface mounted, said array of parallel rows including an inner pin row and an outer pin row, said outer pin row occluding said inner pin row from access by a soldering instrument from said same side of the circuit board, wherein, adjacent to the inner pin row, an opening is provided through said circuit board, said opening having adequate cross-section to enable said soldering instrument to access said inner pin row from a side of the circuit board remote from the component.

2. A printed circuit board according to claim 1, wherein connecting pins of the inner pin row project at least partially into or bridge the opening through the circuit board.

3. A printed circuit board according to claim 1, wherein connecting pins of the inner pin row of the component are bent at edges of the opening in a direction towards the side of the circuit board remote from the component.

4. A printed circuit board according to claim 1, wherein the opening through the circuit board extends substantially centrally with respect to the component.

5. A printed circuit board according to claim 1, wherein the opening is substantially rectangular.

6. A printed circuit board according to claim 1, wherein the component comprises a plug and socket means.

7. A printed circuit board according to claim 6, wherein both the plug and socket means and the opening are located on an edge of the circuit board and the opening is a laterally open cavity in the circuit board.

* * * * *